United States Patent [19]

Cogan

[11] 4,375,124

[45] Mar. 1, 1983

[54] POWER STATIC INDUCTION TRANSISTOR FABRICATION

[75] Inventor: Adrian I. Cogan, Waltham, Mass.

[73] Assignee: GTE Laboratories Incorporated, Waltham, Mass.

[21] Appl. No.: 320,238

[22] Filed: Nov. 12, 1981

[51] Int. Cl.³ .......................................... H01L 21/225
[52] U.S. Cl. ....................................... 29/571; 29/578; 29/580; 148/187; 148/188
[58] Field of Search ......................... 29/571, 578, 580; 148/188, 187

[56] References Cited

U.S. PATENT DOCUMENTS

| | | | |
|---|---|---|---|
| 3,828,230 | 8/1974 | Nishizawa et al. | 357/22 |
| 3,938,241 | 2/1976 | George et al. | 29/571 |
| 3,998,673 | 12/1976 | Chow | 29/571 X |
| 3,999,281 | 12/1976 | Goronkin et al. | 29/571 |
| 4,115,793 | 9/1978 | Nishizawa | 357/22 |
| 4,199,771 | 4/1980 | Nishizawa et al. | 357/22 |
| 4,252,579 | 2/1981 | Ho et al. | 29/571 X |
| 4,262,296 | 4/1981 | Shealy et al. | 357/55 |
| 4,327,476 | 5/1982 | Iwai et al. | 29/580 X |
| 4,328,611 | 5/1982 | Harrington et al. | 29/580 |
| 4,329,772 | 5/1982 | Oikawa et al. | 29/571 |
| 4,333,224 | 6/1982 | Buchanan | 29/571 |

OTHER PUBLICATIONS

Baliga, International Electron Devices Meeting, IEEE, Dec. 1979, pp. 76-78, 784-786.
Nishizawa et al., IEEE Transactions on Electron Devices, vol. Ed-25, No. 3, Mar. 1978, pp. 314-322.
Ohmi, International Electron Devices Meeting, IEEE, Dec. 1979, pp. 84-87.

*Primary Examiner*—G. Ozaki
*Attorney, Agent, or Firm*—J. Stephen Yeo

[57] ABSTRACT

A method for fabricating a gate-source structure for a recessed-gate static induction transistor. The method is characterized by use of doped polysilicon to fill the recessed gate grooves after the gate grooves have been etched and diffused. The gate grooves have depth greater than width and therefore the surface of the polysilicon layer deposit is substantially planar. The planar surface allows photolithographic techniques to be used for formation of gate contact regions and for depositing of metal gate and source electrodes.

4 Claims, 5 Drawing Figures

POWER STATIC INDUCTION TRANSISTOR FABRICATION

BACKGROUND OF THE INVENTION

This invention relates to gate-source structures for static induction transistors and, in particular, to a deeply etched gate structure requiring simple fabrication techniques.

The static induction transistor is a field effect semiconductor device capable of operation at relatively high frequency and power. The transistors are characterized by a short, high resistivity semiconductor channel which may be controllably depleted of carriers. The current-voltage characteristics of the static induction transistor are generally similar to those of a vacuum tube triode. The devices are described by Nishizawa et al in U.S. Pat. No. 3,828,230 issued Aug. 6, 1974 and in U.S. Pat. No. 4,199,771 issued Apr. 22, 1980.

The static induction transistor generally uses vertical geometry with source and drain electrodes placed on opposite sides of a thin, high resistivity layer of one conductivity type. Gate regions of opposite conductivity type are positioned in the high resistivity layer on opposite sides of the source. During operation a reverse bias is applied between the gate region and the remainder of the high resistivity layer causing a depletion region to extend into the channel below the source. As the magnitude of the reverse bias is varied, the source-drain current and voltage derived from an attached energy source will also vary.

The design and fabrication of the gate-source structure is difficult. Deeply etched gate structures generally require several complex processing steps using extremely precise dimensional control for alignment and registration. It is desirable to eliminate fabrication steps requiring precise mask registration and to, where possible, use procedures in which elements of the transistor are self-aligned.

SUMMARY OF THE INVENTION

The present invention discloses a method for fabricating a power static induction transistor having a deeply etched gate structure. The method uses standard processing steps with relaxed mask-registration requirements to form a self-aligned gate-source structure.

The simplified processing sequence begins with the opening of gate and source windows in a silicon dioxide layer formed on a high resistivity epitaxial layer of a first conductivity type. The source window is then protected by masking and recessed gate grooves having depth greater than width are etched through the gate windows into the epitaxial layer. Gate regions of a second or opposite conductivity type are formed by diffusion of impurities into the surfaces of the gate grooves. A doped polysilicon layer of opposite conductivity type is deposited using conventional chemical vapor deposition techniques until the groove is filled and the resulting surface is substantially flat. As an alternative procedure the preceding diffusion step may be omitted and the heavily doped polysilicon layer may be used as an impurity source to form the gate regions. A loose-registration masking step and etching step are used to reopen the source windows in the silicon oxide layer and to pattern gate contact regions. The source regions are formed by implantation and diffusion of impurities of the first conductivity type in the surface of the epitaxial layer exposed by the source window. Metal source and gate electrodes are then deposited using standard photolithographic techniques with relaxed registration requirements.

The elements of the Figures are not drawn to scale and the Figures are intended only for use in explanation of the fabrication steps of the present invention.

DETAILED DESCRIPTION OF THE INVENTION

A wafer, or substrate, of single crystal semiconductor material of a first conductivity type is provided as the supporting structure for fabrication of a field effect semiconductor device or static induction transistor according to the present invention. The substrate may be, by way of example, silicon of n-type conductivity.

Figure 1:
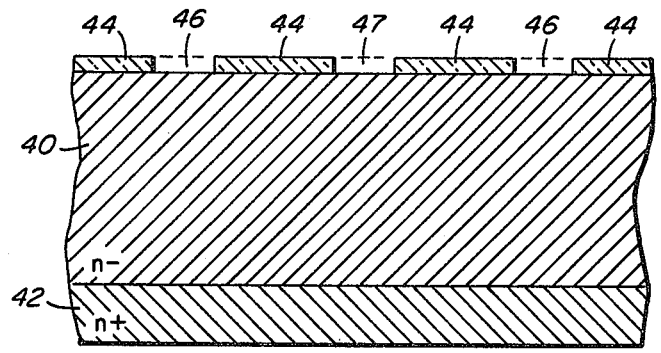
FIG. 1 is a cross-sectional view of a semiconductor crystal after opening of windows in a silicon dioxide layer at the locations of source and gate regions.

FIG. 1 illustrates a fragment of a semiconductor wafer during processing of a static induction transistor according to a preferred embodiment of the present invention. A thick, high resistivity epitaxial layer 40 of n-type conductivity is grown on the upper surface of highly doped substrate 42 of the same conductivity type. Layer 40 is about 15 microns thick and has a resistivity of about 30 ohm-cm. Layer 42 is normally about 250–300 microns and has a resistivity of about 0.01 ohm-cm. A thin layer 44 of silicon dioxide is grown on epitaxial layer 40 using conventional methods. Parallel gate windows 46 and source window 47 are opened in layer 44 at the desired gate region and source region locations using conventional masking and etching procedures.

Figure 2:
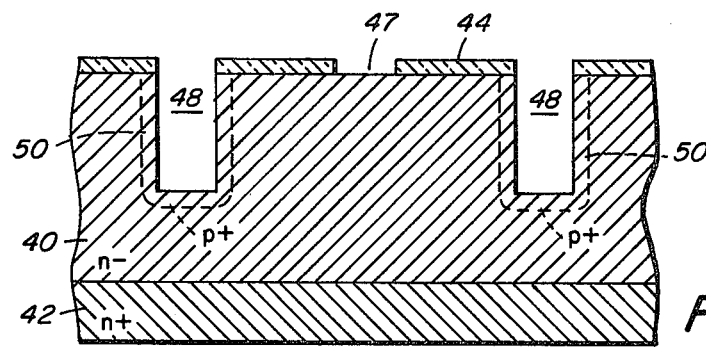
FIG. 2 illustrates formation of gate grooves and diffused gate regions in the semiconductor crystal.

Referring now to FIG. 2, recessed gate grooves 48 are etched under the alternate gate window locations in epitaxial layer 40. The alternate source windows are masked during this step using loose-registration conventional masking techniques. The grooves 48 may, for example, be formed using anisotropical etching in a KOH water solution and a (110) orientation epitaxial layer 40. If plasma etching is used to form grooves 48, any orientation may be used for the silicon wafer. Grooves 48 are preferably formed to have a depth approximately twice the width. For example, the grooves 48 might be 3 to 4 microns deep and 1.5 to 2 microns wide. After etching the grooves 48, gate regions 50 may be formed in epitaxial layer 40 using a conventional pre-diffusion/diffusion sequency of opposite or p-type impurities. The source windows are unmasked after diffusion.

Figure 3:
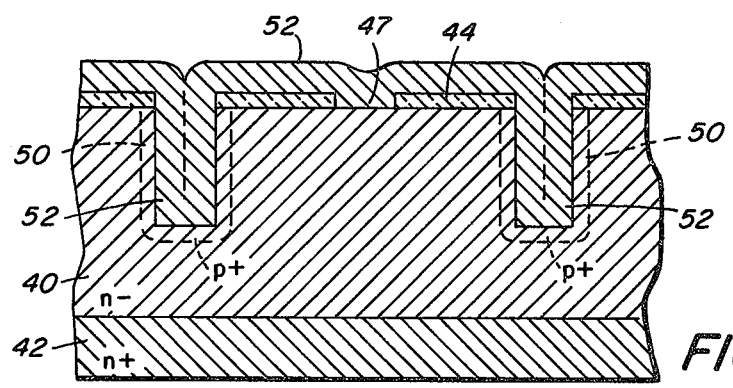
FIG. 3 illustrates formation of a layer of doped polysilicon on the structure.
Figure 4:
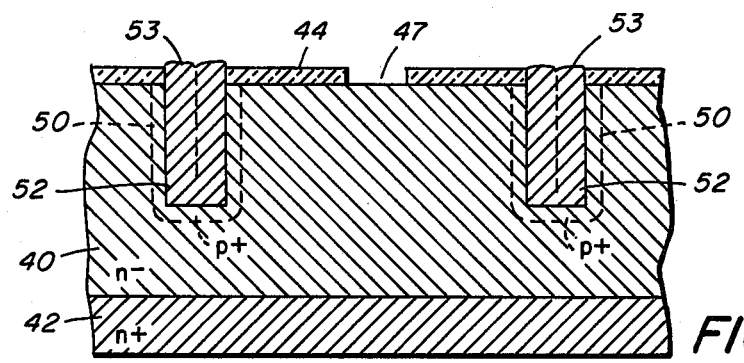
FIG. 4 illustrates opening of the source windows in the doped polysilicon layer.

As shown in FIG. 3, a p-type doped polysilicon layer 52 is deposited on the wafer using conventional chemical vapor deposition techniques. Because the depth of grooves 48 is greater than the width of the grooves, as the thickness of the deposited polysilicon layer 52 approaches half of the groove 48 width, the groove is filled and the surface of the wafer becomes substantially planar. The doped polysilicon layer 52 may be used as the source of impurities for forming gate regions 50, making the preceding pre-diffusion/diffusion step optional. This alternate step for forming gate regions 50 can be accomplished by a short drive-in diffusion cycle. An etching step is next used to remove the excess polysilicon from the wafer surface to form 53 source contact window 47 as illustrated in FIG. 4.

Figure 5:
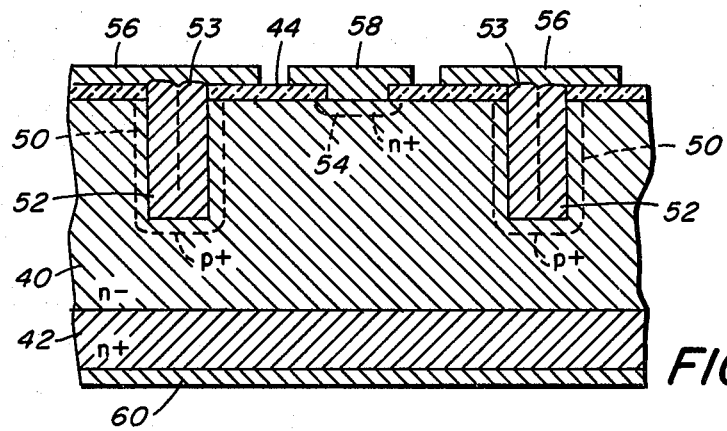
FIG. 5 illustrates formation of the source region and metal deposition to form source and gate electrodes.

Referring to FIG. 5, source region 54 is implanted and formed in epitaxial layer 40 at the location of the source window 47 and metal is deposited to form gate and source electrodes 56 and 58 and patterned using relaxed registration photolithography.

A metal drain electrode 60 is deposited on the under surface of substrate 42 to complete the basic transistor structure. After processing the individual devices can be separated by any one of a number of conventional techniques.

In the various figures a cross-section of a static induction transistor is shown. Gate regions 52 are formed as strips, for example, 100 to 120 microns in length normal to the plane of the cross-section. Similarly, source region 54 is formed as a strip, for example, about 10 microns shorter than the gate regions 52. The length of the regions is primarily limited by the maximum permitted voltage drop along the electrodes which contact the regions. Additionally, a device with a single source and two gates is shown in FIG. 5. For increased power handling capability additional cells or gate-source combinations can be added as is the normal practice without departing from the scope of the invention.

Use of the foregoing procedure requiring no precise registration masking steps results in a self-aligned high-gain, power static induction transistor.

What is claimed is:

1. A method for forming a gate-source structure for a recessed-gate static induction transistor, said method comprising the steps of:

growing a high resistivity epitaxial silicon layer on a semiconductor substrate;
   growing a silicon dioxide layer over said epitaxial layer;
   etching parallel windows through said silicon dioxide layer at predetermined gate and source locations;
   masking said source windows and etching recessed gate grooves in said epitaxial layer, said gate grooves having depth substantially greater than width;
   removing said source window masking;
   depositing a doped polysilicon layer in said gate grooves, in said source windows and on said silicon dioxide layer, said deposit continuing until the surface of said polysilicon layer is substantially planar;
   removing said doped polysilicon layer to open said source windows and to form gate contact regions, said doped layer removal accomplished using relaxed registration photolithography;
   forming source regions in said epitaxial layer at source window locations; and
   depositing metal in said source window and over said gate contact regions to form gate and source electrodes, said metal depositing accomplished using relaxed registration photolithography.

2. A method as defined in claim 1 in which impurities are diffused into said gate grooves after said etching to form said gate grooves and prior to said removing said source window masking.

3. A method as defined in claim 1 in which gate regions are formed adjacent said gate grooves by a drive-in diffusion step after said doped polysilicon layer is deposited and during which impurities from said polysilicon layers are used as a source.

4. A method as defined in claim 1 wherein the depth of said gate grooves is approximately twice the width.

* * * * *